United States Patent [19]

Fleming

[11] 3,995,969
[45] Dec. 7, 1976

[54] FLAT CIRCUIT INSULATION STRIPPING APPARATUS

[76] Inventor: Lawrence T. Fleming, 625 S. Oak Knoll Ave., Pasadena, Calif. 91106

[22] Filed: Oct. 21, 1974

[21] Appl. No.: 516,646

Related U.S. Application Data

[60] Continuation-in-part of Ser. No. 350,888, April 13, 1973, abandoned, which is a continuation-in-part of Ser. No. 71,447, Sept. 11, 1970, abandoned, which is a division of Ser. No. 768,860, Oct. 18, 1968, Pat. No. 3,555,964.

[52] U.S. Cl. .................................... 408/12; 90/14
[51] Int. Cl.² ........................................ B23B 47/18
[58] Field of Search .............. 90/11 C, 14; 408/12, 408/13, 14

[56] References Cited
UNITED STATES PATENTS

| | | | |
|---|---|---|---|
| 2,955,489 | 10/1960 | Hess | 408/12 X |
| 3,283,618 | 11/1966 | Schatzman | 408/11 |
| 3,555,964 | 1/1971 | Fleming | 408/14 X |
| 3,595,132 | 7/1971 | Thacker | 408/12 X |
| 3,720,135 | 3/1973 | Merner et al. | 408/11 X |

*Primary Examiner*—Leonidas Vlachos

[57] ABSTRACT

A mechanical apparatus and tool for clearing small areas of the plastic film insulation in flat flexible circuits and cables to permit making electrical connections to the metal foil conductors. An end-mill-like rotating cutter is fed into the laminated workpiece. Novel cutter geometry provides differential requirements of feed force and torque, cutting two to three times more easily into plastic than into copper. Means are provided to limit the feed force to prevent penetration into the copper foil. Means responsive to torque may be employed to retract the cutting tool automatically. A novel spring-loaded telescoping chuck is applicable to limit the feed force in single-spindle or multiple-spindle machines. The sides of the tool are slightly hollow-ground to reduce the feed-force required. The lips may be ground slightly convex to compensate for the elastic indentation of the workpiece.

5 Claims, 15 Drawing Figures

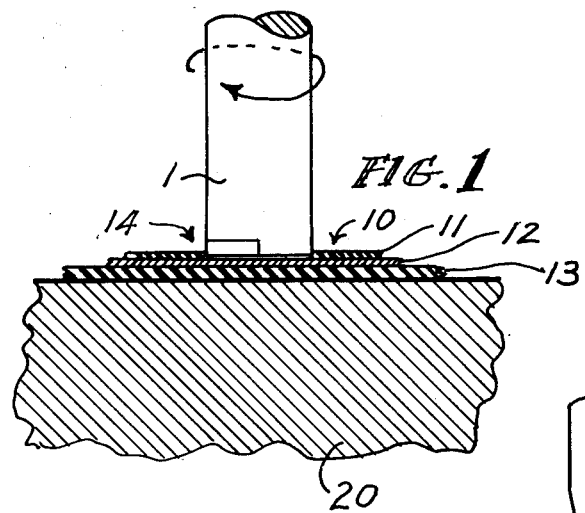
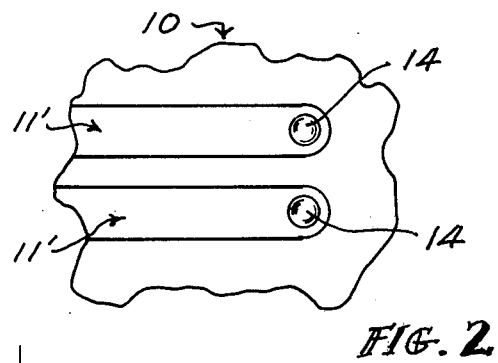
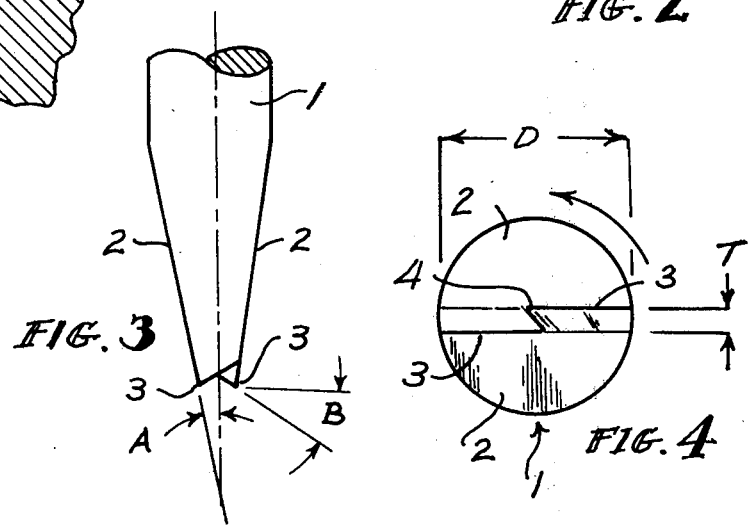
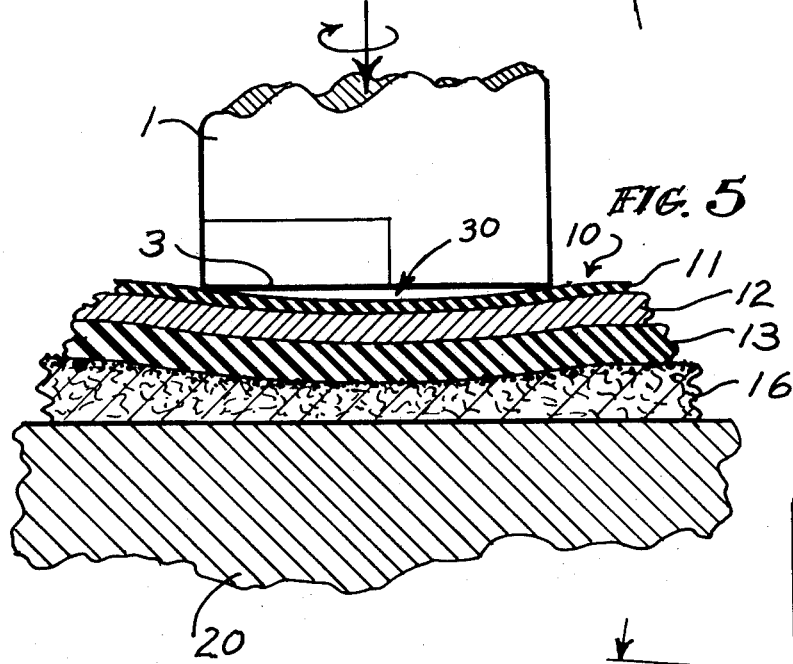
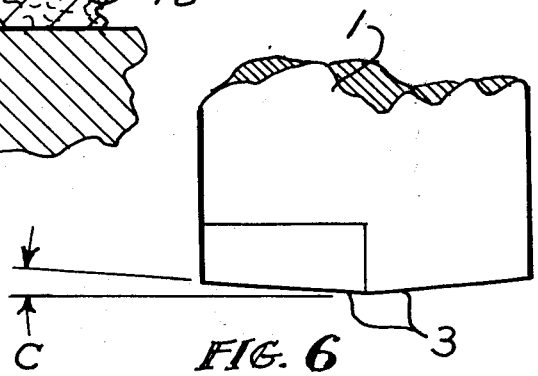

FLAT CIRCUIT INSULATION STRIPPING APPARATUS

REFERENCES TO RELATED APPLICATIONS

This is a continuation-in-part of my prior application Ser. No. 350,888, filed Apr. 13, 1973 now abandoned. That application was in turn a continuation-in-part of my application Ser. No. 71,447, filed Sept. 11, 1970 and now abandoned, which was in turn a division of my application Ser. No. 768,860 filed Oct. 18, 1968 and now U.S. Pat. No. 3,555,964.

BACKGROUND OF THE INVENTION

The electronics industry uses flat flexible cables and circuits made up of copper foil conductors laminated between thin sheets of plastic insulating film. The foil may typically be of "one-two ounce copper" about 0.0027 inches thick, and the film about 0.001 to 0.004 inches. In manufacturing flat circuits, a layer of foil is bonded to one sheet of plastic film and then photo-etched to the desired pattern. A second sheet film is then bonded over the foil.

A problem exists in removing the film at those points where electrical connections are to be made, as by soldering. The film may be pre-punched with holes at the desired locations ("connection pads"), but there are known difficulties in getting accurate registration. Chemical removal of film has been practiced, but is slow. Heated-blade strippers are known but do not work well on high-temperature plastics such fluorocarbon or polyimide compounds. There hence exists a need for another method and means for local film removal which is rapid and does not leave any chemical or adherent residue.

BRIEF SUMMARY

This invention is an apparatus, for clearing insulating film from small local areas of the foil conductors in flat flexible cables and circuits to permit making electrical connections thereto. Such cables and circuits may typically employ conductors of copper foil about 0.0027 inches thick, laminated between sheets of plastic film of the order of 0.001 inch thick.

My prior U.S. Pat. No. 3,555,964 shows a rotating cutter having zero or negative rake angles employed for this purpose; I found that such a cutter has the property of requiring substantially more feed force to cut into copper than it does to cut into any of the plastics normally used in such circuits. The force differential is of the order of 2 or 3 to 1 with a properly-sharpened cutting tool. Conventional end-mills usually have a positive rake angle and pull into the work, tearing through the copper foil. Such commercial end-mills as are made with zero rake tend to require excessive feed force and to act somewhat like fly-cutters at the extremely shallow depths involved: this because commercial sharpening practice may permit "flats" along the cutting lips as wide as 0.001 inch, and because the tip profile of an end mill is normally slightly concave, so that the outer portions of the lips cut first.

The cutting tools of the present invention are preferably made slightly convex at the tip with the lips inclined about 20 to 50 minutes of arc with respect to a normal to the cutter axis. The flat sides adjacent the lips are preferably hollow-ground to a slight degree, and the lips themselves honed so that any "flat" left are less than about a micron wide. Preferably the two lips are made even in height within about ± .0001 inch. These features provide a feed-force requirement for penetration of the plastic of around 300 grams for a cutter of the common 0.070-inch diameter, with penetration into the copper foil less than 0.0002 inch.

With such a cutter, the force required to cut on through the copper foil is typically about 800 grams. The invention accordingly provides means to control and limit the feed force to prevent damage to the foil. Such means may comprise a spring-loaded telescoping chuck or chuck attachment on the machine. The depth stop on the machine, which may be an ordinary sensitive drilling machine, may be set so that the spring exerts the desired downward feed force, e.g., 350 grams for the 0.070-inch cutting tool, when the tool lips contact the workpiece. A plurality of such spring-loaded telescoping chucks or chuck attachments may be used on a multiple-spindle machine, to clear the insulation from a plurality of connection pads at once.

The cutting lips of drills, end mills, and like rotating cutting tools do not extend all the way in to the center line; if they did, the portions of the lips adjacent the center line would not cut appreciably anyway because their linear velocities would approach zero. In the present invention there is a small space between the innermost portions of the cutting lips, typically of the order of 0.015 inch. In the present invention, the resulting failure to cut away the insulating film in a small central area is not necessarily undesirable. Flat circuit connection pads often are provided with holes in the center. When, however, it is desired to remove the film all the way into the center of the spot, the invention provides for a small amount of looseness or play in the above telescoping chuck or attachment. It is found that this is fully adequate to provide even clearing of the entire area, more elaborate apparatus being superfluous. In this modification, the above slight convexity of the tool tip may be increased to provide even clearing.

It has been found that the torque drawn from the spindle of the machine increases by a factor of the order of 2 when the cutter has cut through the plastic and contacted the copper foil. The invention provides for differential torque-sensing means, signal-processing circuits, and means actuated thereby to automatically release the machine feed in response to the sudden increase in torque. Such apparatus may be employed in conjunction with, e.g., a tape-controlled drilling machine to automate the process fully, the "release" signal being used also to actuate the work table or like control means.

DETAILED DESCRIPTION

In the drawing:

FIG. 1 is a side view, partly in section, of a tool of the invention cutting into a laminated flat-circuit workpiece;

FIG. 2 is a top view of a portion of a workpiece showing two cleared areas;

FIG. 3 is a side view of the tip portion of a cutting tool of the invention, enlarged;

FIG. 4 is an enlarged end view of the tool of FIG. 4;

FIG. 5 is a greatly enlarged side view, partly in section, of a cutting tool applied to a laminated workpiece, showing elastic dimpling;

FIG. 6 is an enlarged side view of a tool tip with compensating convex angles;

Figure 15:
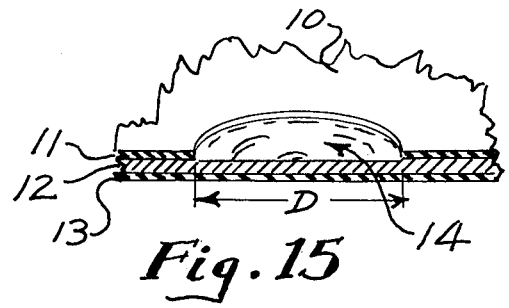

FIG. 15 is a perspective view of a cleared area that has been sectioned, drawn from a microphotograph. In FIG. 1, the cutting tool 1 rotates in the direction of the arrow, cutting into a workpiece 10 which comprises a layer of plastic insulating film 11, a layer of copper foil 12, and another layer of film 13, all bonded together. Workpiece 10 may rest on, or be clamped to, a backing 20 which may be a plate of steel, phenolic, or other material with flat parallel surfaces, resting in turn on the machine table, not shown.

The machine may be an ordinary sensitive drilling machine with the cutting tool 1 held in its chuck. Common cutter tip diameters range from about 0.050 to 0.180 inch. The rotating cutter may be fed downward into the work by the hand control on the machine, with enough feed force to cut through the plastic film layer 11. When the cutter reaches the copper foil layer 12, it will stop cutting unless the feed force is increased substantially, e.g., by a factor of 2 or 3 with a cutter made according to the invention. The copper area 14, FIGS. 1, 2, 10, and 11, which has been cleared of film is burnished by the cutter lips and left clean for subsequent soldering or other connection means. The plastic film is removed in the form of small shavings. These may be brushed away, or removed by means of a suction tube.

This process is now often called "skiving" in the flat flexible circuit industry.

The thickness of copper foil removed is found to be too small to measure reliably. i.e., less than 0.0002 inch. Even this may represent plastic compression of the foil; it is discussed further in respect to FIG. 15.

A suitable machine speed is 1500 rpm.

FIG. 2 shows top views of two such cleared areas 14. The areas 11' in FIG. 2 indicate foil conductors laminated between the plastic film layers 11 and 13. The remainder of the portion shown of workpiece 10 has no conductors, the two film layers being bonded directly together.

FIG. 3 is an enlarged side view of the tip portion of a cutter according to the invention. The cylindrical body of the cutter 1 is ground with two flat tapering portions 2, 2 which terminate in the cutting lips 3, 3. The rake angle of the lips is indicated at A, and is preferably of the order of 3° to 8° negative, as shown. The clearance of backoff angle B is preferably between about 30° and 50°. Cutters ground with the greater angle B require lower feed force but tend to become dull more quickly. The choice of angle B depends somewhat on the particular kind of plastic film 11 to be skived, and the nature and condition of the machine and the operator.

FIG. 4 is an end view of the cutter of FIG. 3, showing the cutting lips 3, 3. The arrow indicates the direction of rotation. The width or thickness of the tip portion is disignated by T, and is preferably from one-sixth to one-eighth the tip diameter D. The tapered, generally wedge-like shape of the end portion of the cutter 1 permits the operator to see the cleared area 14 while he is working.

An advantage of the two-lip configuration, as contrasted with single-lip cutters, is that the cutting forces of the two lips balance each other, so that the cutter does not tend to push the workpiece around in its own plane in an orbital path. This is particularly desirable when the workpiece is positioned and held by hand. To attain the desirable balance, it is necessary that the two lips 3, 3 be at precisely the same depth. This may be accomplished in final finishing of the tool during manufacture. by hand-honing the lips under a microscope of about 20-power and checking the profile in a high-power optical comparator. The lips should be of symmetrical profile and even in depth within considerably less than 0.001 inch. Experience in correlating cutting tests with profile observations indicates that the tolerance is of the order of 0.0002 inch maximum, i.e., ±0.0001 inch.

It is also necessary that the cutting lips be dead sharp. This condition may be met during the hand-honing operation by observing light reflections off the lips from a suitably-placed collimated source. When the "line of light" reflection disappears from an edge, it is sharp enough. A "flat" 0.001 inch wide is often encountered in badly-worn tools, and represents gross dullness. A "flat" of about 1 micron is about the maximum for a newly-sharpened tool. The final operations may be performed with 600-grit diamond-plated hones. The cutters are preferably made of solid tungsten carbide.

FIG. 5 indicates, greatly enlarged, the elastic dimpling of the surface of a workpiece under the feed force of a cutter 1. An anti-slip backing 16 is shown under the layers 11–13 of the workpiece 10. The backing 16 may be of commercial 600-grit abrasive paper, glued to the backing plate 20. Such anti-slip backing is desirable for hand-positioned work with cutters in the larger sizes such as $D = 0.140$ inch. The feed force, indicated by arrow P, elastically deforms the workpiece in the immediate vicinity of the tip of cutter 1 as shown in FIG. 5. This dimpling, greatly exaggerated in FIG. 5, produces a slightly concave surface under the cutter, so that there is a slight clearance, indicated at 30, between the center portion of the cutter tip and the work.

This effect manifests itself by the cutter clearing the outer peripheral portion of the cleared area (as 14, FIGS. 1, 2) first. Additional feed force may be required to complete the cut all the way into the center portion, leading to an undesirable ring-shaped bulge on the back of the workpiece and the possibility of cutting undesirably into the copper foil.

According to the invention, the cutter lips may be ground to a slightly convex shape as shown in FIG. 6. The angle C, which may be called a compensating angle, may suitably be about 30 minutes of arc. This angle is found suitable for workpiece material which comprises two 0.001-inch layers of film. For thicker film layers, or for material of lower elastic modulus, the angle C may be increased, and vice-versa.

Figure 7:
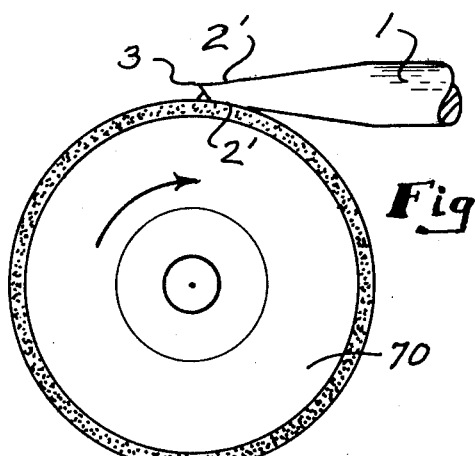
FIG. 7 is a side view of a cutting tool and grinding wheel for hollow-grinding.
Figure 8:
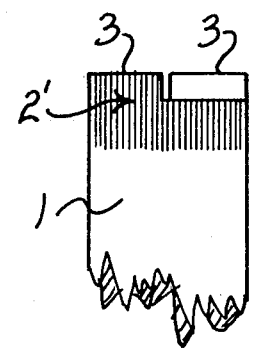
FIG. 8 is an enlarged side view of the tip portion of a tool showing the hollow-ground area.

Referring to FIG. 7, it has been found that the feed force requirement of a given cutter is substantially reduced if it be hollow-ground to a slight degree on a fine grit wheel. A wheel 70, preferably of 600-grit resinoid-bonded diamond, may be rotated at a relatively slow speed such as 1800 rpm, and the tool 1 positioned in the manner shown and pressed against the wheel with an ounce or so of pressure. The small area adjacent the tip is ground to a fine finish. Such areas are indicated at 2' in FIGS. 7 and 8. The amount of material removed is small, typically reducing the width T of the tip (See FIG. 4) by less than 0.001 inch. The resulting hollow-grind reduces the negative rake angle A, FIG. 2, to a small extent; its main advantage is believed to lie in the provision of a uniform homogeneous side to the cutting lip, free from microscopic chipped portions.

Figure 9:
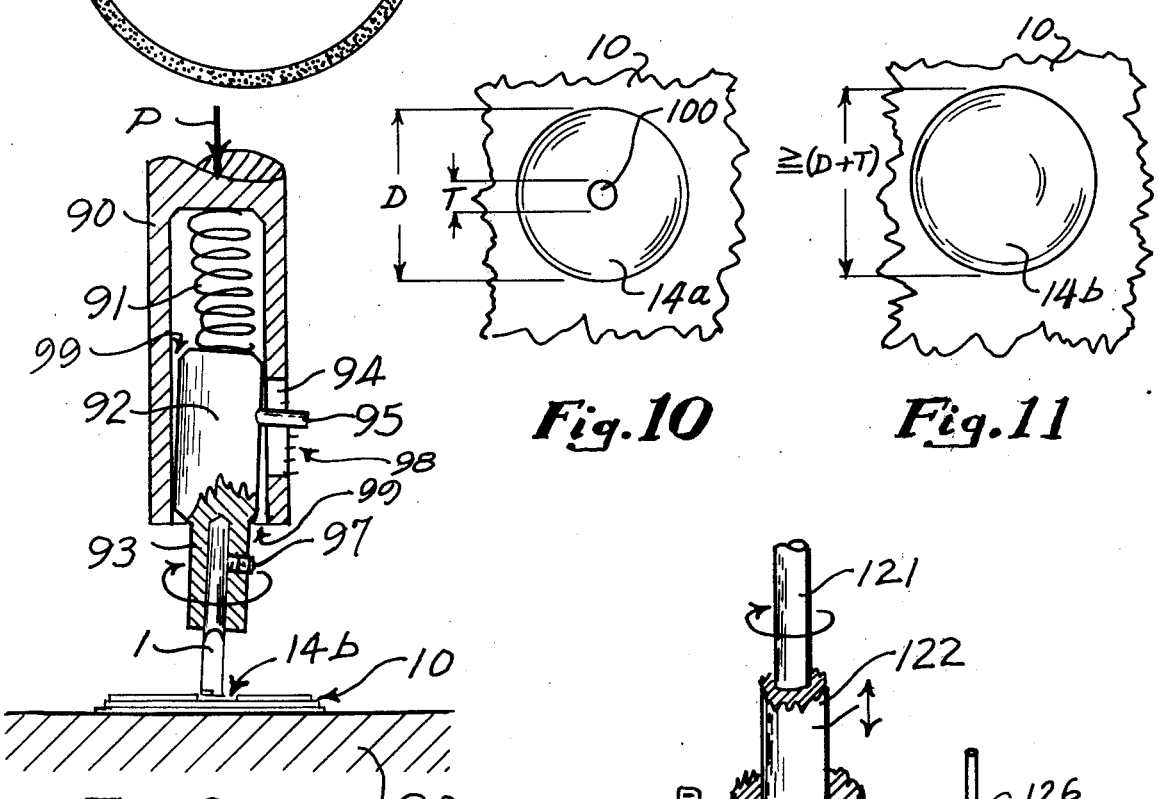
FIG. 9 is a partial sectional view of a spring-loaded telescoping chuck of the invention.

FIG. 9 is a partial cross-sectional view, enlarged, of a spring-loaded telescoping chuck according to the invention. It comprises a chuck body 90 which may be affixed to the end of the spindle shaft in any suitable drill press or like machine. Slidable inside the body 90 is a plunger 92 fitted into a bore therein, and urged downward by a spring 91. Plunger 92 is restrained from rotation relatively to body 90 by any suitable means such as a pin 95 slidable up and down in a milled slot 94. Splines, a more elaborate but similar means, may obviously be used instead. The lower portion 93 of plunger 92 is bored to receive the shank of a cutting or skiving tool 1 of the type described above. This shank may in turn be secured in place, against relative rotation, by a set screw 95. Obviously, any other suitable securing chuck means, such as a collet, may be employed. The length of the slot 94 may be, e.g., about ¼-inch. Along its side there may be graduations indicated at 98 (but not actually visible in) FIG. 9, and shown in FIG. 12. These graduations may represent the force exerted by spring 91 in, e.g., grams as the plunger 92 telescopes into body 90 and compresses the spring 91. A suitable range is 0 – 1 kilogram.

It will be apparent that the feed force P (FIG. 9) will vary linearly as the amount of compression of sping 91, and hence that the force P may be pre-set at any convenient value by presetting the depth to which spring 91 is compressed. This may be accomplished by means of the depth stop on the drilling machine to which the chuck body 90 is attached. A suitable, and conventional, depth stop is shown at 124 in FIG. 12, to be described later. Thus, the depth stop on the machine may be set to a point where the feed force P is enough to permit the cutting tool 1 to cut through the top plastic film layer of the workpiece 10, but not enough to cut appreciably into the underlying copper foil conductor, such as 12 in FIGS. 1, 3, and 15, the last to be described later. The feed force ratio, as described earlier, is of the order of 2 or 3 to 1. It will be seen that the spring-loaded telescoping chuck described above will serve to insure reliable clearing of the insulating film from the foil, and insure positively that the cutter lips will not penetrate appreciably the foil conductor, without any special attention from the machine operator.

Figures 10, 11:
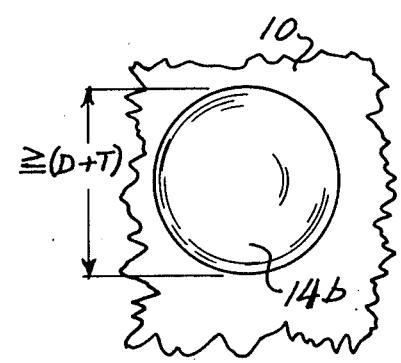
FIGS. 10 and 11 are enlarged top view of cleared areas of a workpiece.

Another feature of the telescoping chuck of FIG. 9 is that a controlled amount of looseness or play may be introduced between the plunger 92 and the bore in the chuck body 90. Suppose that there is no play nor runout anywhere in the spindle and chuck system of the machine. Then the cutter 1 will clear an area 14a such as is shown in FIG. 10. Due to the gap T between the cutter lips, FIG. 4, a perfectly-centered cutter will leave an uncleared spot 100 in the center of the cleared area 14a of FIG. 10. As noted earlier, connection pads may be provided with holes in the center, so that such an uncleared area 100, of diameter T, is not always undesirable. In other instances it may not be wanted. Since, however, it is not possible to make a rotative end-cutting tool that will cut all the way to the center without some translatory motion of its axis, the present invention provides for a small controlled degree of displacement of the cutter tip in the plane perpendicular to its axis. Such displacement may be provided by a suitable mechanism operating to move the backing plate 20 orbitally in its own plane in a circular orbit of about diameter T, FIG. 10, i.e. around 0.01 to 0.025 inches. A simpler and equally effective means is, however, to provide a suitable small amount of looseness or play between the outside diameter of the plunger 92, FIG. 9, and the bore in the body 90. The clearance, greatly exaggerated, is indicated at 99, FIG. 9. In practice it amounts to a clearance of the order of 0.002 to 0.003 inches, approximately.

With the cutter "cocked" due to such clearance, it will clear an area such as is shown at 14b in FIG. 11, where the overall diameter of the cleared spot is equal to or greater than (D+T), FIGS. 4 and 10, and the uncleared central "tit" 100 is now absent, having been cut away by the inner portions of the lips of cutter 1.

When the cutter is so "cocked", its axis may lie at an angle of the order of 30 minutes of arc with respect to the axis of the machine spindle. This would place the outer edges of the cutting lips 3 further into the work by roughly 0.0002 inch in a 0.06-inch diameter cutter. The convex or compensating angle C, FIG. 6 may be used to compensate. Where the above 30minutes-of-arc amount of play or clearance is provided in the telescoping chuck such as 90, etc., the angle C, FIG. 6, may be increased to about 1°. This will accomodate both the play in the telescoping chuck and the elastic indentation of the workpiece, the latter described above in relation to FIGS. 5 and 6.

Figure 12:
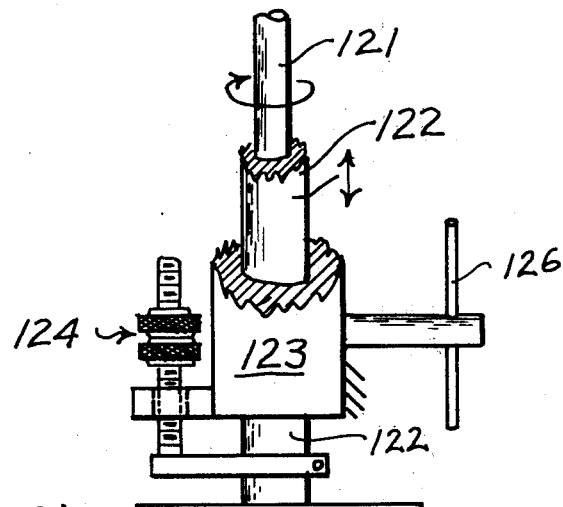
FIG. 12 is a simplified side view of a portion of a multiple-spindle machine with telescoping chucks of the type shown in FIG. 9.

FIG. 12 illustrates semi-diagrammatically a multiple-spindle drilling machine equipped with three telescoping spring-loaded chucks of the kind shown in FIG. 9. The machine is shown as comprising elements of a conventional drill press, i.e., spindle 121, an axially-displaceable quill 122, and a frame portion 123. A feed lever 126 serves to move the quill 122, and with it the spindle 121, up and down with respect to the machine table 120. Attached to the lower portion of quill 122 is shown a multiple-spindle drilling attachment 125. This may have any desired suitable number of spindles; three are shown for convenience of illustration. When the cutters 10 are chucked to uniform depths so that their tips are all in line, it will be apparent that a given downward displacement of the quill 122 will apply equal feed forces to each cutter via the compression of the chuck springs 91 (FIG. 9). Thus a plurality of connection pads can be cleared simultaneously with reliability as high as for clearing them one at a time by the means of FIG. 9.

In FIG. 12 it is apparant that when the depth of cut is small, the variation, during the cut, of the force of spring 91 (FIG. 9) of spring-loaded chuck 90 may also be small. Examples are given above of an insulating film 11 that is 0.001 inch thick, of a maximum travel for plunger 92 of ¼ inch, and a range for spring 91 of 0–1 kilogram. With these constants the spring rate would be 4 grams per 0.001 inch of displacement of plunger 92 (FIG. 9). Such a 4-gram variation during a cut 0.001 inch deep would be less than 2 percent of the typical feed force value of 300 grams which was given above for an ordinary cutter 0.070 inch in diameter. Thus the spring-loaded telescoping chuck 90 may supply a reasonably constant spring force throughout the depth of a very shallow cut.

In the instrument art the term "transducer" or "sensor" is applied to any device that translates or converts the magnitude of some physical variable into an anologous magnitude of some other variable, such as pressure into resistance or voltage. In this field a spring may be regarded as a sensor or sensing means which translates the magnitude of a force into an analogous magnitude of displacement, or the other way around, a displacement into a force.

Figure 13:
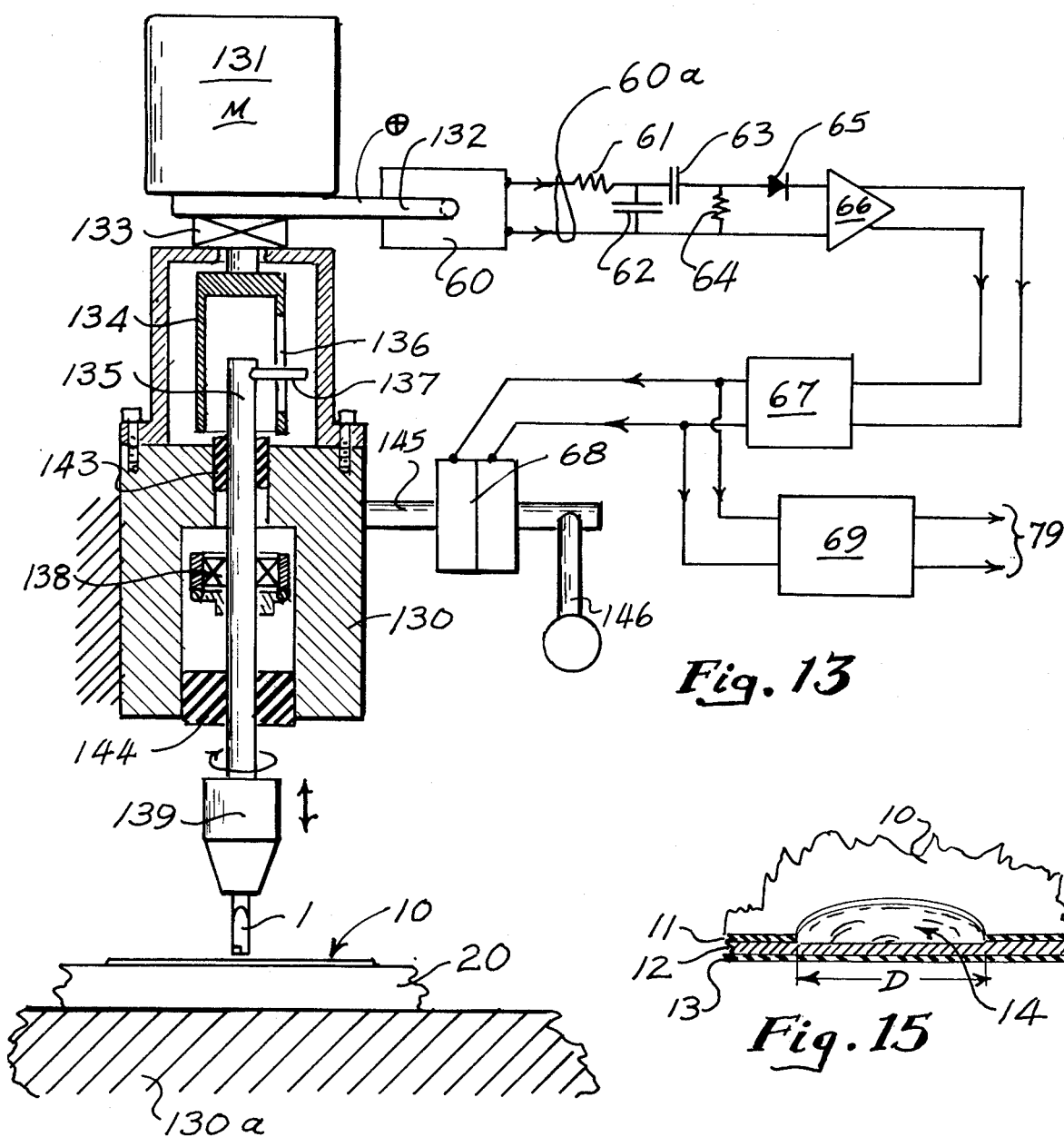
FIG. 13 is a simplified sectional view of a machine with torque-sensing means and control circuits shown diagrammatically.
Figure 14:
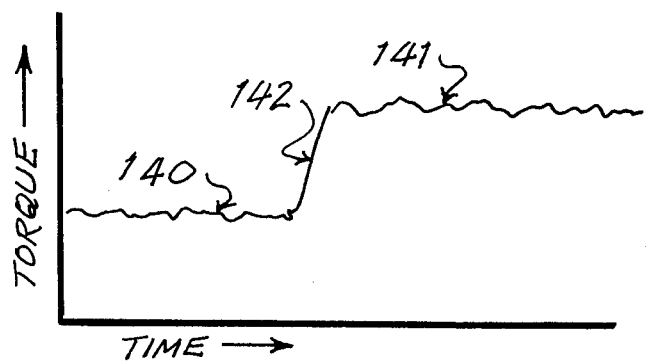
FIG. 14 is a graph showing the increase in torque.

FIG. 13 shows semi-diagrammatically a machine and apparatus for releasing the downfeed automatically when the torque drawn from the spindle increases due to the cutter lips encountering the copper foil 12 in the workpiece. An set forth above, this torque has been found then to increase by about a factor of 2. FIG. 14 is a graph of such a torque relation versus time. It takes a second or two, in a typical cut, for the cutter to cut through the plastic film 11. As time progresses from the beginning of the operation, this torque level is indicated at 140 in FIG. 14. The irregularities in the curve are due to minor assymmetry of the cutter lips, motor vibration, and the like. As the feed force P (FIGS. 5 and 9) is maintained, the torque drawn from the spindle increases abruptly when the cutter encounters the copper foil as indicated at 142, FIG. 14, and remains at this higher value as at 141 so long as the feed force is maintained.

Referring back to FIG. 13, a drilling machine is shown having a frame portion 130, a motor 131, and a spindle shaft 135. Shaft 135 is both rotatable and axially displaceable in sleeve bearings 143, 144. It may be displaced up and down by a feed mechanism, not shown, of any suitable type linking a feed lever 146 and shaft 145 to a suitable bearing 138 attached to a central portion of the spindle shaft 135. Shaft 135 is driven directly by motor 131 through a telescoping mechanical axial connection comprising a hollow member 134 having a slot 136, and a pin 137 protruding from shaft 135. This is the equivalent of a spline connection, which is not needed for the small torques involved. The motor 131 may be mounted on a bearing 133 so that its frame is rotatable through a relatively small arc. A lever 132 may be connected to the motor frame, and its far end connected to operate a mechanoelectric transducer 60 of any suitable type, for example a differential transformer. When the torque increases, the frame of motor 131 rotates slightly in its bearing 133 and actuates the transducer 60, providing a changed electrical signal level at its output leads 60a, whose voltage vs. time graph may look like FIG. 14. Conventional kinds of circuitry may follow to process this signal into an electrical pulse or step suitable for disengaging the machine feed. Such circuitry may take the form of an integrating R-C circuit of relatively short time constant to smooth out the small ripples in the curve (FIG. 14), shown at 61, 62, followed by a long-time-constant differentiator 63, 64 to effect operation on the transition 142 (FIG. 14) rather than on absolute d.c. values of signal. A conventional diode 65 and amplifier 66 are connected to feed a comparator and power circuit 67 of any suitable type, which in turn releases a magnetic clutch 68 in response to the torque transition 142 (FIG. 14). The magnetic clutch 68 is connected between the hand feed lever 146 of the machine, and the feed control shaft 145 of the machine, so that the torque transition 142 serves to disconnect the feed lever from the feed mechanism and return the cutting tool to a position above the workpiece.

The cutting tool is indicated at 1 in FIG. 13, the workpiece at 10, the work support plate or jig at 20, and a portion of the machine table itself at 130a.

FIG. 15 is a drawing made from a microphotograph of a spot 14 cleared from a workpiece 10. The specimen was embedded in transparent plastic, then sawed across a diameter of the cleared area 14, and polished. The spot diameter D was 0.050 inch, and the thickness of the copper foil layer 12, 0.0027 inch. In the cleared area 14 the reduction in thickness of the copper was just noticeable, and is estimated at 5 to 10 percent.

Referring back to FIG. 13, the invention contemplates the combination of the torque-sensing means illustrated with the mechanism of a tape-controlled drilling or milling machine or the like. The "feed release" signal fed from the circuit 67 as previously described, may also be fed to circuits 69 of the tape-controlled machine, not shown. Such circuits are those which initiate, as via leads 79, the automatic positioning of the workpiece to a new position where the next selected portion of it lies under the cutting tool 1. By these means the clearing of all the connection pads on a flat circuit may be fully automated.

The particular kind of drilling machine shown in FIG. 13 is merely illustrative. Any suitable machine, and any known type of torque-sensing means, may be employed in this form of the invention. Another form of torque-sensing comprises measuring the armature current of the motor such as 131, where the motor is of the d-c type with a shunt or permanent-magnet field; this well-known means requires no illustration.

Any suitable known means may also be employed to sense and/or control the feed force P, FIGS. 5 and 9. A large variety of force and torque transducers are known to the art of electronic instrumentation. For example, a quartz piezoelectric force transducer of a commercially available type may be set into the top surface of backing plate 20, FIGS. 1, 5, 13; or resistance strain gages applied to the feed lever, such as the one shown at 146 in FIG. 13.

Referring back to FIG. 6, it is found that the small angle of convexity C provides a further advantage in that it acts as a pilot to some degree, markedly reducing the tendency of a given tool to pull the workpiece in an orbital manner in its own plane. Thus the convexity C provides both more uniform clearing of the spots 14, and a centering action as well.

I claim:

1. An insulation stripping apparatus for a flat flexible electrical circuit workpiece of soft metal foil conductors laminated between sheets of insulating film, comprising:
   a rotatable cutting tool having a generally cylindrical body portion and sharp cutting lips extending transversely across its end portion and each being inclined convexly to a normal to the axis of said body portion at an angle between 0° and 1° and having a rake angle between about 0° and 8° negative,
   said tool requiring a first value of feed force to cut into said insulating film and a second, larger value to cut into said foil,
   said second value being at least about twice said first value,
   a machine having a rotary spindle, means for driving said spindle, and chuck means driven by said spindle to rotate said tool;

feed means for imparting a feed stroke to said spindle, force-sensing means to sense said feed force and translate it into another analogous variable quantity, and means to limit said feed force to a value between said first and second values so that the force is sufficient to permit said tool to cut through said insulating film but insufficient to cut substantially into the underlying metal foil, said tool merely burnishing the foil which it has exposed.

2. Apparatus as in claim 1 wherein said lips are two in number and extend symmetrically from about the center to the periphery of a narrow tip portion, there being a small central non-cutting space between the innermost portions of said cutting lips, and two symmetrical inclined wedge-like surfaces extending from said tip portion to said body portion.

3. Apparatus as in claim 1 wherein:

said machine has a depth stop and said spindle is equipped with a telescoping spring-loaded chuck, said tool being held in said chuck, said depth stop being settable to provide a predetermined compression of the spring in said chuck to provide a predetermined feed force when said tool is brought into contact with said workpiece by said feed means;

the spring in said chuck acting as said force-sensing means translating feed force into a telescoping displacement which is limited by said depth stop.

4. Apparatus as in claim 3 wherein said machine is equipped with a plurality of spindles, each said spindle being equipped with a said telescoping spring-loaded chuck.

5. Apparatus as in claim 3 wherein:

the small central non-cutting space between the innermost portions of said cutting lips is adapted to leave an uncut central spot on said workpiece, said telescoping spring-loaded chuck comprises a hollow body portion and a plunger portion, and a predetermined clearance is provided between said body and plunger portions to permit the tip portion of said tool to wobble sufficiently to cut away said central spot.

* * * * *